United States Patent [19]
Syrjälä; Markku

[11] Patent Number: 5,460,901
[45] Date of Patent: Oct. 24, 1995

[54] BATTERY IDENTIFICATION

[75] Inventor: Markku Syrjälä, Halikko, Finland

[73] Assignee: Nokia Mobile Phones Limited, Salo, Finland

[21] Appl. No.: 125,282

[22] Filed: Sep. 22, 1993

[30] Foreign Application Priority Data

Sep. 29, 1992 [GB] United Kingdom ............... 9220555

[51] Int. Cl.$^6$ ................................. H01M 10/48
[52] U.S. Cl. ............................................. 429/90
[58] Field of Search ........................... 429/90, 92, 7

[56] References Cited

U.S. PATENT DOCUMENTS

| | | | |
|---|---|---|---|
| 4,992,340 | 2/1991 | Tidwell et al. | 429/90 X |
| 5,095,537 | 3/1992 | Caillet et al. | 455/66 |
| 5,180,641 | 1/1993 | Burns et al. | 429/7 X |
| 5,206,097 | 4/1993 | Burns et al. | 429/90 |

FOREIGN PATENT DOCUMENTS

| | | |
|---|---|---|
| 2121971 | 1/1984 | United Kingdom . |
| 2147109 | 5/1985 | United Kingdom . |
| WO83/02005 | 6/1983 | WIPO . |

Primary Examiner—Stephen Kalafut
Attorney, Agent, or Firm—Perman & Green

[57] ABSTRACT

A battery (1) has identification means for enabling an apparatus e.g. a radio telephone or a battery charger, connected to the battery to determine a plurality of battery parameters e.g. temperature and battery capacity using a single measurement, so that, for example, a battery charger can adopt the correct charging regime for the battery type. The identification means is provided by a constant current source (I) and one or more solid state components (D1–D3) having p-n junctions e.g. diodes or transistors coupled in series or in parallel. As the threshold voltage ($V_D$) of p-n junctions vary with temperature, and the number of components can be made to vary with battery type, by measuring the total voltage drop (Vo) across series connected components or current through parallel connected components which will vary with temperature and the number of components, a single signal can provide information on more than one battery parameter.

14 Claims, 3 Drawing Sheets

Fig. 3.

| $V_0$ | TEMP. | BATTERY TYPE |
|---|---|---|
| $V_1$ | $T_1$ | A |
| $V_2$ | $T_2$ | A |
| $V_3$ | $T_3$ | A |
| $V_4$ | $T_4$ | A |
| $V_5$ | $T_5$ | A |
| $V_6$ | $T_6$ | A |
| $V_7$ | $T_1$ | B |
| $V_8$ | $T_2$ | B |
| $V_9$ | $T_3$ | B |
| $V_{10}$ | $T_4$ | B |
| $V_{11}$ | $T_5$ | B |
| $V_{12}$ | $T_6$ | B |

BATTERY IDENTIFICATION

The present invention relates to the identification of battery parameters.

BACKGROUND OF THE INVENTION

Batteries of different chemical types, such as lithium, NiCd, and lead-acid batteries, have different voltage characteristics and different effective series resistances during the remaining time of usage. In many cases apparatus, such as radio-telephones, can use batteries of various types for their power supply. For this reason, it is useful to know various battery parameters e.g. the type, size, capacity and temperature of the battery being used, so that the proper operational parameters can be set for the apparatus, for a battery charger charging the battery, or to inform the user that the battery capacity is running out.

A battery charger may be able to charge batteries of several types, so the charger must be capable of adapting the charging rate, amongst other parameters, to the type and the capacity of the battery. Consequently, it would be useful if the battery charger could automatically recognize the type and the capacity of the battery to be charged, so that it can adapt the charging parameters accordingly.

Batteries comprise one or more electrochemical cells, supplying electrical energy by means of a chemical reaction. The type of the electrochemical cells may determine the capacity, the effective resistance, the physical set-up, or any other operational parameter. The battery may comprise several identical cells, or a combination of several different cells. The temperature of the battery could appropriately be measured in order to permit a break, for instance, during fast charging of the battery, when the temperature of the electrochemical cells exceeds a selected temperature, or to permit a break when a pre-determined voltage threshold is reached, the voltage level being temperature-compensated i.e. as a function of the temperature of the electrochemical cell.

Some battery types, e.g. those having a NiCd cell, may be damaged unless the fast charging is carefully supervised. The high temperature generated during the fast charging may cause damage to the battery, and in extreme cases, even an explosion of the battery. It is also known that charging a battery at a lower rate than its maximal rate, but at a higher rate than its minimal rate, also risks damage to the battery.

It is preferable if apparatus which can use different types of battery is able to determine the type and condition of a battery and to adapt its operating parameters accordingly. One such feature is an alarm indicating when the remaining charge of the battery is below a predetermined threshold value, the alarm being given to the user of the apparatus through the user interface connection. In this case, the battery voltage is measured in the usual way, and when the battery voltage drops below the predetermined threshold value, a light signal is switched on or the operator is given some other indication of the near-exhaustion of the useful charge. Typically, the device is allowed to operate only over a limited period of time after it has been observed that the charge state of the battery is low. A second parameter may consist of a second battery voltage threshold, which, when detected, causes the apparatus to be completely disabled and so protects those battery types, e.g. NiCd and lithium types, which cannot be discharged below a given charging level without risking permanent damage to the electrochemical cells.

Other parameters can be set according to the battery type. For instance, in cellular radio-telephones, the output of the transmitter can be set to a maximal level determined by the specific battery type used. Apart from monitoring the remaining charge, the parameter to be set according to the battery type may be a detection of the charging state, which is usually carried out in terms of the polar voltage of the battery. Batteries of different types have different characteristic curves of polar voltage-charging in relation to the remaining charge and also different charging capacity values and, thus, a predetermined and fixed voltage threshold for determining when to stop charging the battery may be optimal for one type of battery, but not for another.

In the prior art, battery temperature has been measured, for example, with a negative temperature co-efficient (NTC) resistor or individual diodes, and battery capacity has been detected either by mechanical recognition or by using separate components e.g. resistors of various sizes integrated in the battery, whereby the value of the component is measured and the battery capacity subsequently determined by comparing the value of the measured component with a stored table in a memory. Batteries of various sizes may thus have different resistors, the values of which are used to recognize the battery type. This means that separate components are needed both for battery temperature measurement and battery type identification, and this means an increased number of components and therefore an increased number of contacts between the battery and the apparatus, and, in turn a higher price for the battery and for the device to which the battery is connected.

SUMMARY OF THE INVENTION

According to the present invention, there is provided a battery for use in an electrical apparatus the battery comprising a plurality of interconnected cells and means for providing a common identification signal indicative of a plurality of battery parameters.

This has the advantage that, since, a detection level indicative of more than one battery parameter e.g. the battery temperature and capacity is provided by a single identification signal the number of components as well as the cost of battery production can be reduced. Moreover, fewer terminals are needed both in the battery and in any apparatus e.g. battery charger, to be coupled to the battery, since the battery temperature as well as capacity data can be obtained by a single measurement of the voltage/current at a single point.

BRIEF DESCRIPTION OF THE DRAWINGS

Embodiments of the invention will now be described, by way of example only, with reference to the accompanying drawings, of which:

FIG. 3 schematically illustrates a look-up table used in the embodiments of FIGS. 1 and 2.

DETAILED DESCRIPTION OF THE PREFERRED EMBODIMENTS

Figure 1:
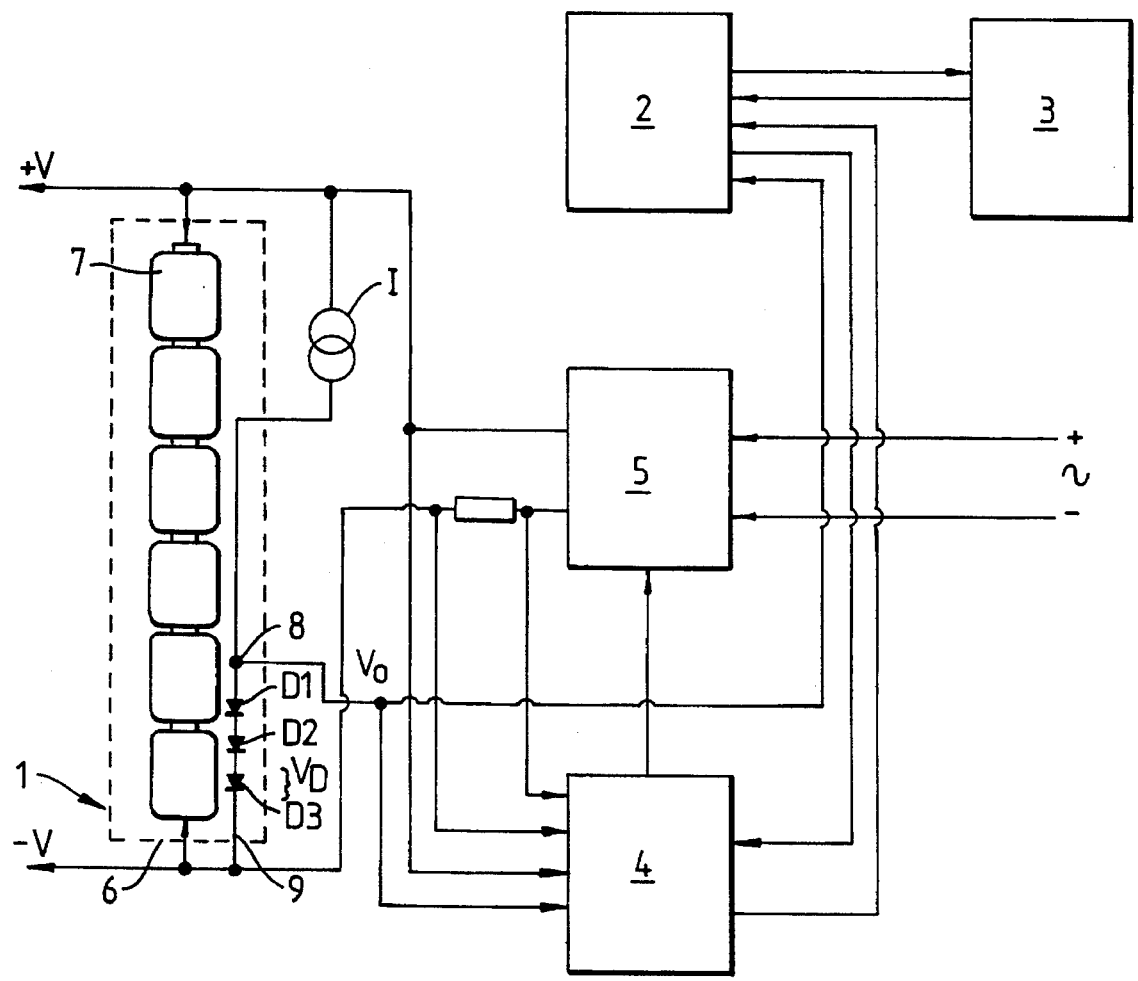
FIG. 1 illustrates, in block diagram form, a first embodiment of the invention.

FIG. 1 shows an embodiment of the invention where a battery 1 is coupled to a battery charger 5 for charging the battery. The circuit illustrated in FIG. 1 allows the charge state i.e. condition of a battery 1 to be supervised and calculated. The circuit comprises a processor 2, which supervises and processes battery temperature, capacity and other parameters, and stores the data in a memory 3 and compares this data with data stored in a look-up table in the memory 3. Furthermore, the processor 2 transmits data to and receives data from a control unit 4, which controls the charger 5, for example by controlling the charging period.

The battery 1 and the charger 5 are each provided with a pair of connector terminals (not shown), via which the two are electrically coupled and via which the supplied power and the capacity, temperature and other major parameter data passes.

The battery 1 comprises a battery housing 6 enclosing one or more (in this case, six) rechargeable cells 7. In the battery housing 6, two or more components D, preferably p-n diodes, are series connected in the vicinity of the battery cells 7. In this embodiment, three diodes D1,D2,D3 are used. The diodes D1–D3 are series connected between the positive and negative operating voltage poles +V and −V which are used to supply an operating voltage from the cells 7 to an apparatus to which the battery 1 is connected. An output voltage Vo is obtained between the anode 8 of the first diode D1 and the cathode 9 of the last diode D3 which is coupled to the negative pole −V. Between the positive pole +V and the anode 8 of the first diode D1, a constant current source or resistor, I, is connected, to provide a constant current through the diodes D1–D3, so that the diodes D1–D3 are biased into an electroconductive state i.e. forward biased, and such that the voltage $V_D$ across each diode D1 to D3 is approximately of the order of the threshold voltage of the respective diode D1–D3. The output voltage Vo is supplied to the processor 2 as a detection level for determining the battery parameters.

The temperature of the battery cells 7 can be calculated based on the sum $V_o$ of the individual threshold voltages $V_D$.

Because the threshold voltage $V_D$ of each component varies as a function of the temperature a measure of the threshold voltage of the individual components will allow the temperature of the battery to be determined, while a combination of the total voltages across the coupled components can be used to determine another battery parameter e.g. capacity if the number of the components is chosen to vary with each battery type. Thus, by coupling together several of one type of component allows more than one battery parameter e.g. both temperature and capacity to be determined using a single measurement.

The threshold voltage $V_D$ of each diode D varies inversely with the temperature, so the threshold voltage $V_D$ will decrease as the temperature increases. The variation of the threshold voltage also depends on the materials used for producing the component, the variation typically being −2.2 mV/°C. with a silicon diode, and here the minus sign marks a decrease of the threshold voltage $V_D$ as the temperature increases. Under these circumstances, the temperature can be calculated on the basis of the variation of the threshold voltages $V_D$ of each individual connected diodes.

For enabling the capacity of the battery 1 to be determined, a predetermined number of diodes D are series connected in order to uniquely indicate the capacity of the battery 1, i.e. a different number of diodes are used for each battery type. Thus the type of, and therefore, capacity of, the battery 1 can be determined on the basis of the output voltage $V_0$, which is the sum of the individual diode threshold voltages $V_D$ and which will vary according to the number of series connected diodes D1–D3. A number of the series connected diodes D1–D3 can be replaced with transistors.

The control unit 4 receives the battery type and capacity data from the processor 2 on the basis of the output voltage $V_0$. Using the output voltage $V_0$, and data stored in a look-up table 10 in the memory 3, the processor 2 is able to determine both the battery temperature and capacity (battery type). For example, the measured output voltage $V_0$, is compared with voltage values stored in the look-up tables. The look-up table 10 may contain a range of voltage values $V_1$–$V_{12}$, wherein values $V_1$–$V_6$ relate to battery temperatures $T_1$–$T_6$ for a first battery type A and values $V_7$–$V_{12}$ relate to battery temperatures $T_1$–$T_6$ for a second battery type B. This is illustrated schematically in FIG. 3. So, for example, an output voltage $V_0=V_3$ would indicate battery type A at a temperature $T_3$, while an output voltage $V_0=V_8$ would indicate battery type B at temperature $T_2$, and so on. In this way battery type, and hence capacity, can be determined as well as temperature using a single measurement.

As discussed in the preamble, when the battery 1 is being charged, the charger 5 needs information about the battery temperature and capacity. The battery charger 5 may consist of a rectifier circuit, a current source and a control circuit. The charger 5 receives the battery type and capacity data from control unit 4 based on the output voltage $V_0$ supplied to the processor 2, which compares this with data stored in the look-up table 10 in the memory 3 and supplies the battery type and capacity data to the control unit. On the basis of this data a control circuit (not shown) in the charger sets the rate of charging and the type of charging e.g. fast charging, in order to provide an optimal charging regime for the battery.

The present invention can be used for selecting other charging control parameters, such as a voltage break, i.e. the point at which the polar voltage of the battery exceeds a selected voltage threshold (according to the battery type), a temperature break, whereby the charging is stopped when the temperature of the electromechanical cells 7 rises above the selected temperature, or a temperature-controlled voltage break, whereby the voltage break threshold is selectively temperature-compensated depending on the temperature of the electrochemical cells 7. As discussed in the preamble, the correct charging regime is important to maintain the life of the battery. Therefore, the use of the present invention for determining the battery type and capacity enables the optimal maximal and minimal charging rate to be retrieved from the memory 3 by means of a peripheral circuitry, used for charging the battery type concerned.

The generated output voltage $V_o$ also enables an apparatus (not shown), for example, a radio receiver, to which the battery 1 is connected to determine the type of the battery and to adapt its operating parameters such as those discussed in the preamble accordingly.

Figure 2:
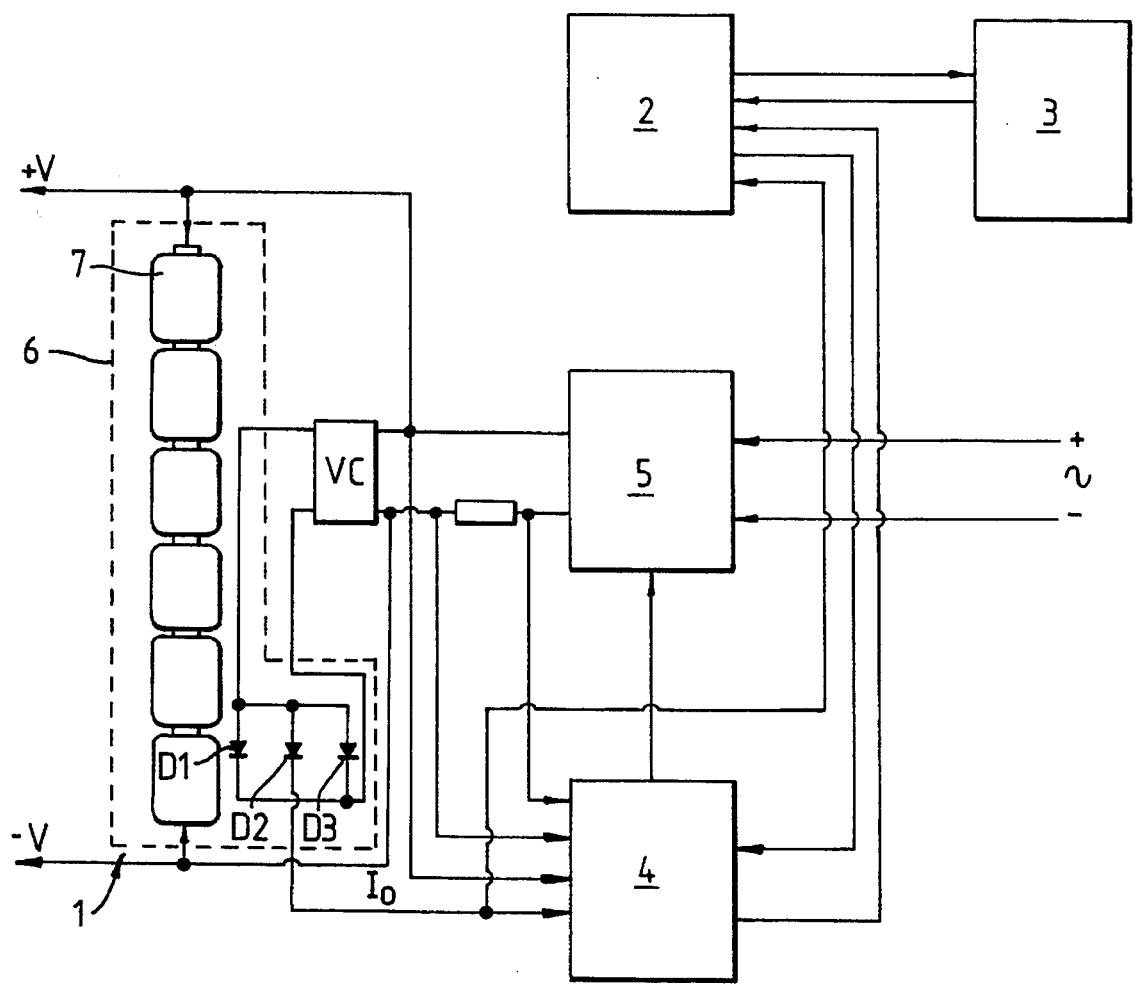
FIG. 2 shows a second embodiment of the invention also in block diagram form.

A second embodiment of the invention is illustrated in FIG. 2, in which the diodes D1–D3, are connected in parallel, rather than in series. The diodes D1–D3 are forward or reverse biased by connecting a positive or negative voltage VC thereto. The sum $I_o$ of the currents flowing through the diodes D1–D3 is used to indicate the capacity of the battery 1, this sum $I_o$ varying step-wise as a function of the number of parallel connected diodes. In other words, a different number of diodes is provided for each battery type.

The current flowing through the individual diodes is a function of the reverse saturation current. The backward saturation current increases about 7%/°C., and this means that the current flowing through the front diode, biased either forward or reverse, is proportional to the temperature, so that the sum $I_o$ of the currents flowing through the parallel connected diodes D1–D3 also allows the temperature of the battery to be determined.

The value of $I_o$ is used to determine the battery type and temperature using the look-up table as described in relation to the first embodiment.

The present invention can be applied for instance in batteries used in radio-telephones, allowing the choice of several batteries of the same physical size but of different capacity or composition. Batteries of different types have different discharge and charge characteristics.

In the two embodiments disclosed here, the processor 2, memory 3, control unit 4, charger 5, voltage supply VC, constant current source/resistor I, and battery 1 are described as individual units. In practice, for example in a radio telephone, the processor 2, memory 3 and control unit 4 would be part of the telephone's circuitry and would also be used in the operation of the telephone. Appropriate connections would be provided for establishing the various couplings between the processor 2, memory 3 and control unit 4 and the battery 1 and the charger 5. The biasing voltage VC could be taken from the charger 5.

Alternatively, the processor 2, memory 3, and the control unit 4 could be integrated either into the battery 1, or into the housing with the charger 5.

It will be evident, from the foregoing description, to a person skilled in the art, that various modifications are possible within the scope of the present invention. For example, the circuit could be adapted to determine other battery parameters, or to enable other apparatus coupled to the battery pack to adapt their operation to the battery type.

I claim:

1. A battery for use in an electrical apparatus, the battery comprising:

a plurality of interconnected cells; and means, operably connected to the cells and variable in response to a first battery parameter, for providing a common identification signal indicative of the first battery parameter and a second independent battery parameter.

2. A battery according to claim 1 wherein the common identification signal providing means comprises at least one component having a property which varies in dependence upon the first battery parameter, and the number of components of the signal providing means is selected in dependence of the second battery parameter such that a value of the identification signal varies as a function of the first and second battery parameters.

3. A battery according to claim 2 wherein the components comprise a respective p-n junction whose threshold voltage is the variable property.

4. A battery according to claim 3 wherein the components are coupled in series such that the value of the identification signal is dependent on the sum of the threshold voltages, this value being indicative of the first and second battery parameters.

5. A battery according to claim 3 wherein the components are coupled in parallel such that the value of the identification signal is dependent on the sum of the current through the parallel coupled components, this value being indicative of the first and second battery parameters.

6. A battery according to claim 2 wherein the at least one component is a diode.

7. A battery according to claim 2 wherein the at least one component is a transistor.

8. In a battery having interconnected cells, the improvement comprising:

an identification signal generator operably connected to the cells, the generator being adapted to generate a single signal indicative of at least two separate and independent battery parameters.

9. A battery as in claim 8 wherein the generator comprises at least one component having a property which varies in dependence upon a first one of the battery parameters and, the number of components is provided to provide a second one of the battery parameters.

10. A battery according to claim 9 wherein the at least one component comprise a respective p-n junction whose threshold voltage is the variable property.

11. A battery according to claim 10 wherein at least two of the components are coupled in series such that the value of the identification signal is dependent on the sum of the threshold voltages, this value being indicative of the first and second battery parameters.

12. A battery according to claim 10 wherein at least two of the components are coupled in parallel such that the value of the identification signal is dependent on the sum of the current through the parallel coupled components, this value being indicative of the first and second battery parameters.

13. A battery according to claim 9 wherein the at least one component is a diode.

14. A battery according to claim 9 wherein the at least one component is a transistor.

* * * * *